(12) United States Patent
Peeters et al.

(10) Patent No.: US 9,235,125 B2
(45) Date of Patent: Jan. 12, 2016

(54) METHODS OF PROVIDING PATTERNED CHEMICAL EPITAXY TEMPLATES FOR SELF-ASSEMBLABLE BLOCK COPOLYMERS FOR USE IN DEVICE LITHOGRAPHY

(71) Applicant: ASML Netherlands B.V., Veldhoven (NL)

(72) Inventors: Emiel Peeters, Eindhoven (NL); Wilhelmus Sebastianus Marcus Maria Ketelaars, Eindhoven (NL); Sander Frederik Wuister, Eindhoven (NL); Roelof Koole, Eindhoven (NL); Christianus Martinus Van Heesch, Eindhoven (NL); Aurelie Marie Andree Brizard, Eindhoven (NL); Henri Marie Joseph Boots, Best (NL); Thanh Trung Nguyen, Eindhoven (NL); Oktay Yildirim, Eindhoven (NL)

(73) Assignee: ASML NETHERLANDS B.V., Veldhoven (NL)

(*) Notice: Subject to any disclaimer, the term of this patent is extended or adjusted under 35 U.S.C. 154(b) by 0 days.

(21) Appl. No.: 14/380,911

(22) PCT Filed: Feb. 6, 2013

(86) PCT No.: PCT/EP2013/052306
§ 371 (c)(1),
(2) Date: Aug. 25, 2014

(87) PCT Pub. No.: WO2013/127608
PCT Pub. Date: Sep. 6, 2013

(65) Prior Publication Data
US 2015/0010869 A1    Jan. 8, 2015

Related U.S. Application Data

(60) Provisional application No. 61/606,231, filed on Mar. 2, 2012.

(51) Int. Cl.
*G03F 7/20* (2006.01)
*G03F 7/038* (2006.01)
*G03F 7/00* (2006.01)
*B82Y 10/00* (2011.01)
*B82Y 40/00* (2011.01)

(52) U.S. Cl.
CPC . *G03F 7/20* (2013.01); *B82Y 10/00* (2013.01); *B82Y 40/00* (2013.01); *G03F 7/0002* (2013.01); *G03F 7/038* (2013.01); *G03F 7/2002* (2013.01)

(58) Field of Classification Search
CPC .............. H01L 2924/15165; H01L 31/0512; H01L 21/0337; H01L 21/31144; H01L 21/0274; H01L 21/32139; G03F 7/0002; G03F 7/038; G03F 7/0035; G03F 7/004; G03F 7/2002; H04L 12/282; H04L 2012/285; H04L 2012/2841; H05B 37/0272
USPC ................................................. 430/296, 322
See application file for complete search history.

(56) References Cited

U.S. PATENT DOCUMENTS

| 6,423,465 B1 | 7/2002 | Hawker et al. |
| 2007/0134420 A1 | 6/2007 | Koberstein et al. |

(Continued)

FOREIGN PATENT DOCUMENTS

WO    2011/128120    10/2011

OTHER PUBLICATIONS

International Search Report mailed Sep. 12, 2013 in corresponding International Patent Application No. PCT/EP2013/052306.

(Continued)

*Primary Examiner* — Caleen Sullivan
(74) *Attorney, Agent, or Firm* — Pillsbury Winthrop Shaw Pittman LLP (57) ABSTRACT

A method of forming a patterned chemical epitaxy template, for orientation of a self-assemblable block copolymer including first and second polymer blocks, on a surface of a substrate, the method including applying a primer layer of a primer composition to the surface, the primer composition including a first polymer moiety having a chemical affinity with the first polymer blocks and a second polymer moiety having a chemical affinity with the second polymer blocks, selectively exposing the surface, the primer layer and any overlying layer to actinic radiation to provide exposed and unexposed regions, to render labile the first polymer moiety in the exposed region, and removing the labile first polymer moiety from the exposed region to deplete the primer layer surface in the exposed region of first polymer moiety to form the patterned chemical epitaxy template.

20 Claims, 3 Drawing Sheets

(56) References Cited

U.S. PATENT DOCUMENTS

| | | |
|---|---|---|
| 2009/0035668 A1 | 2/2009 | Breyta et al. |
| 2011/0039061 A1 | 2/2011 | Fedynyshyn et al. |
| 2012/0116007 A1 | 5/2012 | Gopalan et al. |
| 2012/0217220 A1 | 8/2012 | Dobisz et al. |
| 2012/0238109 A1 | 9/2012 | Hattori et al. |

OTHER PUBLICATIONS

Richard P. Kingsborough et al., "Lithographically directed materials assembly," Proc. of SPIE, vol. 7271, pp. 72712D-1-72712D-10 (2009).

Jing Cheng et al., "Developing Directly Photodefinable Substrate Guiding Layers for Block Copolymer Directed Self-Assembly (DAS) Patterning," Proc. of SPIE, vol. 7972, pp. 797221-1-797221-13 (Mar. 17, 2011).

Miri Park et al., "Block Copolymer Lithography: Periodic Arrays of ~$10^{11}$ Holes in 1 Square Centimeter," Science, vol. 276, pp. 1401-1404 (May 30, 1997).

Joy Y. Cheng et al., "Simple and Versatile Methods to Integrate Directed Self-Assembly with Optical Lithography Using a Polarity-Switched Photoresist," ACS Nano, vol. 4, No. 8, pp, 4815-4823 (2010).

Eungnak Han et al., "Chemical Patterns from Surface Grafted Resists for Directed Assembly of Block Copolymers," ACS Nano, vol. 6, No. 2, pp. 1823-1829 (Jan. 15, 2012).

Seung Hak Park et al., "Block copolymer multiple patterning integrated with conventional ArF lithography," Soft Matter, vol. 6, pp. 120-125 (2010).

METHODS OF PROVIDING PATTERNED CHEMICAL EPITAXY TEMPLATES FOR SELF-ASSEMBLABLE BLOCK COPOLYMERS FOR USE IN DEVICE LITHOGRAPHY

CROSS-REFERENCE TO RELATED APPLICATIONS

This application is the U.S. national phase entry of PCT patent application no. PCT/EP2013/052306, which was filed on Feb. 6, 2013, which claims the benefit of priority of U.S. provisional application No. 61/606,231, which was filed on Mar. 2, 2012, which is incorporated herein in its entirety by reference.

FIELD

The present invention relates to a method of forming a patterned chemical epitaxy template to direct self-assembly of a polymer on a surface of a substrate. The invention also relates to formation of a self-assembled polymer layer on such a substrate and a method for device lithography using a resist layer of self-assembled polymer deposited and assembled on such a substrate using a patterned chemical epitaxy template to direct self-assembly.

BACKGROUND

In lithography for device manufacture, there is an ongoing desire to reduce the size of features in a lithographic pattern in order to increase the density of features on a given substrate area. Patterns of smaller features having critical dimensions (CD) at nano-scale allow for greater concentrations of device or circuit structures, yielding potential improvements in size reduction and manufacturing costs for electronic and other devices. In photolithography, the push for smaller features has resulted in the development of technologies such as immersion lithography and extreme ultraviolet (EUV) lithography.

So-called imprint lithography generally involves the use of a "stamp" (often referred to as an imprint template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint template.

For both photolithography and for imprint lithography, it is desirable to provide high resolution patterning of surfaces, for example of an imprint template or of other substrates, and chemical resists may be used to achieve this.

The use of self-assembly of a block copolymer (BCP) has been considered as a potential method for improving the resolution to a better value than obtainable by prior art lithography methods or as an alternative to electron beam lithography for preparation of imprint templates.

A self-assemblable block copolymer is a compound useful in nanofabrication because it may undergo an order-disorder transition on cooling below a certain temperature (order-disorder transition temperature $T_{OD}$) resulting in phase separation of copolymer blocks of different chemical nature to form ordered, chemically distinct domains with dimensions of tens of nanometers or even less than 10 nm. The size and shape of the domains may be controlled by manipulating the molecular weight and composition of the different block types of the copolymer. The interfaces between the domains may have widths of the order of 1-5 nm and may be manipulated by modification of the chemical compositions of the blocks of the copolymers.

The feasibility of using thin films of block copolymers as self-assembling templates was demonstrated by Chaikin and Register, et al., Science 276, 1401 (1997). Dense arrays of dots and holes with dimensions of 20 nm were transferred from a thin film of poly(styrene-block-isoprene) to a silicon nitride substrate.

A block copolymer comprises different blocks, each comprising one or more identical monomers, and arranged side-by side along the polymer chain. Each block may contain many monomers of its respective type. So, for instance, an A-B block copolymer may have a plurality of type A monomers in the (or each) A block and a plurality of type B monomers in the (or each) B block. An example of a suitable block copolymer is, for instance, a polymer having covalently linked blocks of polystyrene (PS) monomer (hydrophobic block) and polymethylmethacrylate (PMMA) monomer (hydrophilic block). Other block copolymers with blocks of differing hydrophobicity/hydrophilicity may be useful. For instance a tri-block copolymer such as (A-B-C) block copolymer may be useful, as may an alternating or periodic block copolymer e.g. $[-A-B-A-B-A-B-]_n$ or $[-A-B-C-A-B-C]_m$ where n and m are integers. The blocks may be connected to each other by covalent links in a linear or branched fashion (e.g., a star or branched configuration).

A block copolymer may form many different phases upon self-assembly, dependent upon the volume fractions of the blocks, degree of polymerization within each block type (i.e. number of monomers of each respective type within each respective block), the optional use of a solvent and surface interactions. When applied in a thin film, the geometric confinement may pose additional boundary conditions that may limit the numbers of phases. In general spherical (e.g. cubic), cylindrical (e.g. tetragonal or hexagonal) and lamellar phases (i.e. self-assembled phases with cubic, hexagonal or lamellar space-filling symmetry) are practically observed in thin films of self-assembled block copolymers, and the phase type observed may depend upon the relative volume fractions of the different polymer blocks.

Suitable block copolymers for use as a self-assemblable polymer include, but are not limited to, poly(styrene-b-methylmethacrylate), poly(styrene-b-2-vinylpyridone), poly (styrene-b-butadiene), poly(styrene-b-ferrocenyldimethylsilane), poly(styrene-b-ethyleneoxide), poly(ethyleneoxide-b-isoprene). The symbol "b" signifies "block" Although these are di-block copolymer examples, it will be apparent that self-assembly may also employ a tri-block, tetrablock or other multi-block copolymer.

The self-assembled polymer phases may orient with symmetry axes parallel or perpendicular to the substrate and lamellar and cylindrical phases are interesting for lithography applications, as they may provide a resist to form line and space patterns and hole arrays, respectively, when oriented with their domains lying side-by-side on a substrate, and may provide good contrast when one of the domain types is subsequently etched.

Two methods used to guide or direct self-assembly of a polymer, such as a block copolymer, onto a surface are graphoepitaxy and chemical pre-patterning, also called chemical epitaxy. In the graphoepitaxy method, self-organization of a block copolymer is guided by topological pre-patterning of the substrate. A self-aligned block copolymer can form a parallel linear pattern with adjacent lines of the different polymer block domains in the trenches defined by the patterned substrate. For instance if the block copolymer is a di-block copolymer with A and B blocks within the polymer chain, where A is hydrophilic and B is hydrophobic in nature, the A blocks may assemble into domains formed adjacent to a side-wall of a trench if the side-wall is also hydrophilic in nature. Resolution may be improved over the resolution of the patterned substrate by the block copolymer pattern subdividing the spacing of a pre-pattern on the substrate.

In the chemical pre-patterning method (referred to herein as chemical epitaxy), the self-assembly of block copolymer domains is guided by a chemical pattern (i.e. a chemical template) on the substrate. Chemical affinity between the chemical pattern and at least one of the types of copolymer blocks within the polymer chain may result in the precise placement (also referred to herein as "pinning") of one of the domain types onto a corresponding region of the chemical pattern on the substrate. For instance if the block copolymer is a di-block copolymer with A and B blocks, where A is hydrophilic and B is hydrophobic in nature, and the chemical pattern comprises a hydrophobic region on a hydrophilic surface, the B domain may preferentially assemble onto the hydrophobic region. As with the graphoepitaxy method of alignment, the resolution may be improved over the resolution of the patterned substrate by the block copolymer pattern subdividing the spacing of pre-patterned features on the substrate (so-called density multiplication). Chemical pre-patterning is not limited to a linear pre-pattern; for instance the pre-pattern may be in the form of a 2-D array of dots suitable as a pattern for use with a cylindrical phase-forming block copolymer. Graphoepitaxy and chemical pre-patterning may be used, for instance, to guide the self-organization of lamellar or cylindrical phases, where the different domain types are arranged side-by-side on a surface of a substrate.

SUMMARY

In a process to implement the use of block copolymer self-assembly in nanofabrication, a substrate may be modified with a neutral orientation control layer, as part of the chemical pre-pattern or graphoepitaxy template, to induce the preferred orientation of the self-assembly pattern in relation to the substrate. For some block copolymers used in self-assemblable polymer layers, there may be a preferential interaction between one of the blocks and the substrate surface that may result in orientation. For instance, for a polystyrene(PS)-b-PMMA block copolymer, the PMMA block will preferentially wet (i.e. have a high chemical affinity with) an oxide surface and this may be used to induce the self-assembled pattern to lie oriented parallel to the plane of the surface. Perpendicular orientation may be induced, for instance, by depositing a neutral orientation layer onto the surface rendering the substrate surface neutral to both blocks, in other words the neutral orientation layer has a similar chemical affinity for each block, such that both blocks wet the neutral orientation layer at the surface in a similar manner. By "perpendicular orientation" it is meant that the domains of each block will be positioned side-by-side at the substrate surface, with the interfacial regions between domains of different blocks lying substantially perpendicular to the plane of the surface.

A neutral surface for use in chemical epitaxy and graphoepitaxy is particularly useful. It may be used on surfaces between specific orientation regions of an epitaxy template. For instance in a chemical epitaxy template to align a di-block copolymer with A and B blocks, where A is hydrophilic and B is hydrophobic in nature, the chemical pattern may comprise hydrophobic pinning regions with a neutral orientation region between the hydrophobic regions. The B domain may preferentially assemble onto the hydrophobic pinning regions, with several alternating domains of A and B blocks aligned over the neutral region between the specific (pinning) orientation regions of the chemical pre-pattern.

For instance in a graphoepitaxy template to align such a di-block copolymer the pattern may comprise hydrophobic resist features with a neutral orientation region between the hydrophobic resist features. The B domain may preferentially assemble alongside the hydrophobic resist features, with several alternating domains of A and B blocks aligned over the neutral orientation region between the specific (pinning) orientation resist features of the graphoepitaxy template.

A neutral orientation layer may, for instance, be created by use of random copolymer brushes which are covalently linked to the substrate by reaction of a hydroxyl terminal group, or some other reactive end group, to oxide at the substrate surface. In other arrangements for neutral orientation layer formation, a crosslinkable random copolymer or an appropriate silane (i.e. molecules with a substituted reactive silane, such as a (tri)chlorosilane or (tri)methoxysilane, also known as silyl, end group) may be used to render a surface neutral by acting as an intermediate layer between the substrate surface and the layer of self-assemblable polymer. Such a silane based neutral orientation layer will typically be present as a monolayer whereas a crosslinkable polymer is typically not present as a monolayer and may have a layer thickness of typically less than or equal to 40 nm, or less than or equal to 20 nm. The neutral orientation layer may, for instance, be provided with one or more gaps therein to permit one of the block types of the self-assemblable layer to come into direct contact with the substrate below the neutral orientation layer. This may be useful for anchoring, pinning or aligning a domain of a particular block type of the self-assemblable polymer layer to the substrate, with the substrate surface acting as a specific orientation feature.

A thin layer of self-assemblable polymer may be deposited onto a substrate with a graphoepitaxy or chemical epitaxy template as set out above. A suitable method for deposition of the self-assemblable polymer is spin-coating, as this process is capable of providing a well defined, uniform, thin layer of self-assemblable polymer. A suitable layer thickness for a deposited self-assemblable polymer film is approximately 10 to 100 nm. Following deposition of the block copolymer film, the film may still be disordered or only partially ordered and one or more additional steps may be needed to promote and/or complete self-assembly. For instance, the self-assemblable polymer may be deposited as a solution in a solvent, with solvent removal, for instance by evaporation, prior to self-assembly.

Self-assembly of a block copolymer is a process where the assembly of many small components (the block copolymer) results in the formation of a larger more complex structure (the nanometer sized features in the self-assembled pattern, referred to as domains in this specification). Defects arise naturally from the physics controlling the self-assembly of the polymer. Self-assembly is driven by the differences in interactions (i.e. differences in mutual chemical affinity) between A/A, B/B and A/B (or B/A) block pairs of an A-B block copolymer, with the driving force for phase separation described by Flory-Huggins theory for the system under consideration. The use of chemical epitaxy or graphoepitaxy may greatly reduce defect formation.

For a polymer which undergoes self-assembly, the self-assemblable polymer will exhibit an order-disorder temperature $T_{OD}$. $T_{OD}$ may be measured by any suitable technique for assessing the ordered/disordered state of the polymer, such as differential scanning calorimetry (DSC). If layer formation takes place below this temperature, the molecules will be driven to self-assemble. Above the temperature $T_{OD}$, a disordered layer will be formed with the entropy contribution from disordered A/B domains outweighing the enthalpy contribution arising from favorable interactions between neighboring A-A and B-B block pairs in the layer. The self-assemblable polymer may also exhibit a glass transition temperature $T_g$ below which the polymer is effectively immobilized and above which the copolymer molecules may still reorient within a layer relative to neighboring copolymer molecules. The glass transition temperature is suitably measured by differential scanning calorimetry (DSC).

Defects formed during ordering as set out above may be partly removed by annealing. A defect such as a disclination (which is a line defect in which rotational symmetry is violated, e.g. where there is a defect in the orientation of a director) may be annihilated by pairing with other another defect or disclination of opposite sign. Chain mobility of the self-assemblable polymer may be a factor for determining defect migration and annihilation and so annealing may be carried out at a temperature where chain mobility is high but the self-assembled ordered pattern is not lost. This implies temperatures up to a few ° C. above or below the order/disorder temperature $T_{OD}$ for the polymer.

Ordering and defect annihilation may be combined into a single annealing process or a plurality of processes may be used in order to provide a layer of self-assembled polymer such as block copolymer, having an ordered pattern of domains of differing chemical type (of domains of different block types), for use as a resist layer for lithography.

In order to transfer a pattern, such as a device architecture or topology, from the self-assembled polymer layer into the substrate upon which the self-assembled polymer is deposited, typically a first domain type will be removed by so-called breakthrough etching to provide a pattern of a second domain type on the surface of the substrate with the substrate laid bare between the pattern features of the second domain type.

Following the breakthrough etching, the pattern may be transferred by so-called transfer etching using an etching means which is resisted by the second domain type and so forms recesses in the substrate surface where the surface has been laid bare.

Chemical epitaxy can provide good alignment and moderate pitch multiplication, but defects which arise during self-assembly may transfer to neighboring regions. Image placement is generally more accurate for chemical epitaxy. However, methods for the formation of a patterned chemical epitaxy template on a surface of a substrate may require a method that includes complex and undesired process steps such as multiple patterning, thermal reflow and lift-off processes.

Recently, Cheng et al. (Y. Cheng et al, ACS Nano, 2010, 4(8), 4815) showed that it is possible to start with a substrate provided with an appropriate anti-reflection coating (ARC) and spin-coat a polarity switched 193 nm photoresist onto the ARC. After lithographic exposure, the chemically enhanced photoresist is developed in a positive tone and the remaining features trimmed to 30 nm line width. Subsequently, a 193 nm flood exposure and post exposure bake is applied to harden the resist pattern. A crosslinkable neutral orientation layer is then spin-coated and cured, covering both the open substrate areas as well as the resist features. Finally, the resist features and the crosslinked orientation layer attached to the resist features, are removed by lift-off resulting in a sparse chemical epitaxy pattern consisting of alternating regions of neutral orientation layer with regions of bare ARC. Subsequently, a suitable block copolymer is deposited via spin-coating and annealed.

Park et al. (S. H. Park et al, Soft Matter 2010, 6, 120) have reported a different method to obtain a chemical pre-pattern. The method starts with a substrate with ARC coating, neutral orientation layer and positive tone photoresist. After lithographic exposure and development, thermal reflow is used to shrink the openings in the resist to dimensions that are desirable for chemical epitaxy. Subsequently, the neutral orientation layer is etched away in the narrowed resist openings and finally the resist is stripped to generate the chemical pre-pattern. A suitable block copolymer is deposited via spin-coating and annealed.

For a patterned chemical epitaxy template, it is desirable that differences in thickness between adjacent portions of the patterned template are 15 nm or less, in order to avoid defects in the ordered block copolymer self-assembled over the template. It would be desirable to have a process and method for forming a patterned chemical epitaxy template where the pattern may be formed using direct photolithographic patterning of a layer, for instance using UV actinic radiation. In particular, it would be desirable to provide a patterned chemical epitaxy template by direct photolithographic patterning of a neutral orientation layer. It is also desirable that the chemical epitaxy template is not exposed to development, strip or etch media that may alter or modify a surface property of the patterned chemical epitaxy template.

Accordingly, it is desirable to provide, e.g., a simple method for providing a patterned chemical epitaxy template on a substrate surface, for use in directing self-assembly of a layer of block copolymer for subsequent use, e.g., as a resist layer suitable for use in device lithography. In particular, it is desirable to provide, e.g., a method using photolithography, for instance with UV radiation, to form such a template. It is desirable to provide, e.g., a chemical epitaxy template for directing self-assembly of a polymer which addresses or overcomes one or more of the problems in the art for chemical epitaxy templates. For instance, it is desirable to provide a method which removes or reduces the need for chemical treatment of the patterned chemical epitaxy template after exposure to radiation. It is desirable to provide, e.g., a template for directing self-assembly of a polymer which is capable of directing self-assembly of a block copolymer to produce a self-assembled block copolymer layer with low defectivity.

Thus, according to an embodiment of the invention, there is provided a method of forming a patterned chemical epitaxy template, for orientation of a self-assemblable block copolymer comprising first and second polymer blocks, on a surface of a substrate, the method comprising:

applying a primer layer of a primer composition to the surface, the primer composition comprising a first polymer moiety having a chemical affinity with the first polymer blocks and a second polymer moiety having a chemical affinity with the second polymer blocks, wherein the primer layer presents a primer layer surface comprising the first and second polymer moieties, selectively exposing the surface, the primer layer and any overlying layer to actinic radiation to provide exposed and unexposed regions, to render labile the first polymer moiety in the exposed region, and removing the labile first polymer moiety from the exposed region to deplete the primer layer surface in the exposed region of first polymer moiety to form the patterned chemical epitaxy template.

According to an embodiment of the invention, there is provided a method of forming a self-assembled block copolymer layer on a surface of a substrate, the method comprising:

providing a surface of a substrate, having a patterned chemical epitaxy template thereon, by a method described herein, depositing a self-assemblable polymer layer directly onto the patterned chemical epitaxy template, and treating the self-assemblable block copolymer layer to provide self-assembly into an ordered block copolymer layer.

According to an embodiment of the invention, there is provided a lithography method for patterning a surface of a substrate by resist etching, wherein the method comprises providing an ordered block copolymer layer at the surface by a method described herein, wherein the ordered block copolymer layer is used as a resist layer.

According to an embodiment of the invention, there is provided a method of forming a device topography at a surface of a substrate, the method comprising using the ordered block copolymer layer formed by a method described herein as a resist layer while etching the substrate to provide the device topography.

The following features are applicable to all the various embodiments of the invention where appropriate. When suitable, combinations of the following features may be employed as part of methods and compositions described herein, for instance as set out in the claims. The methods and compositions described herein may be particularly suitable for use in device lithography. For instance the methods may be used for treatment or formation of a resist layer of self-assembled polymer for use in patterning a device substrate directly or for use in patterning an imprint template for use in imprint lithography.

The self-assemblable block copolymer may be a block copolymer as set out hereinbefore comprising at least two different block types, referred to as first and second polymer blocks, which are self-assemblable into an ordered polymer layer having the different block types associated into first and second domain types. The block copolymer may be a di-block copolymer or a tri-block or multi-block copolymer. An alternating or periodic block copolymer may also be used as the self-assemblable polymer. Although only two domain types may be mentioned in some of the following aspects and examples, an embodiment of the invention is also applicable to a self-assemblable polymer with three or more different domain types. The self-assemblable block copolymer is desirably a di-block copolymer.

By "chemical affinity", in this specification, is meant the tendency of two differing chemical species to associate together. For instance chemical species which are hydrophilic in nature have a high chemical affinity for water whereas hydrophobic compounds have a low chemical affinity for water but a high chemical affinity for an alkane. Chemical species which are polar in nature have a high chemical affinity for other polar compounds and for water whereas apolar, non-polar or hydrophobic compounds have a low chemical affinity for water and polar species but may exhibit high chemical affinity for other non-polar species such as an alkane or the like. The chemical affinity is related to the free energy associated with an interface between two chemical species: if the interfacial free energy is high, then the two species have a low chemical affinity for each other whereas if the interfacial free energy is low, then the two species have a high chemical affinity for each other. Chemical affinity may also be expressed in terms of "wetting", where a liquid will wet a solid surface if the liquid and surface have a high chemical affinity for each other, whereas the liquid will not wet the surface if there is a low chemical affinity.

By "chemical species" in this specification is meant either a chemical compound such as a molecule, oligomer or polymer, or, in the case of an amphiphilic molecule (i.e. a molecule having at least two interconnected moieties having differing chemical affinities), the term "chemical species" may refer to the different moieties of such molecules. For instance, in the case of a di-block copolymer, the two different polymer blocks making up the block copolymer molecule are considered as two different chemical species having differing chemical affinities.

Throughout this specification, the term "comprising" or "comprises" means including the component(s) specified but not to the exclusion of the presence of others. The term "consisting essentially of" or "consists essentially of" means including the components specified but excluding other components except for materials present as impurities, unavoidable materials present as a result of processes used to provide the components, and components added for a purpose other than achieving the technical effect of the invention. Typically, a composition consisting essentially of a set of components will comprise less than 5% by weight, typically less than 3% by weight, more typically less than 1% by weight of non-specified components. The terms "consist of" or "consisting of" mean including the components specified but excluding the deliberate addition of other components.

Whenever appropriate, the use of the term "comprises" or "comprising" may also be taken to include the meaning "consist of" or "consisting of", "consists essentially of" or "consisting essentially of".

In this specification, when reference is made to the thickness of a feature, the thickness is suitably measured by an appropriate means along an axis normal to the substrate surface and passing through the centroid of the feature. Thickness may suitably be measured by a technique such as interferometry or assessed through knowledge of etch rate.

Wherever mention is made of a "layer" in this specification, the layer referred to is to be taken to be layer of substantially uniform thickness, where present. By "substantially uniform thickness" is meant that the thickness does not vary by more than 10%, desirably not more than 5% of its average value across the layer.

By "bonding" or "linking" as referred to herein, it is meant that a bond such as a covalent bond, ionic bond or hydrogen bond is present, either within a molecule, or between a surface and a molecule, i.e. a bond stronger than mere van der Waals attraction. Desirably, the bonding or linking referred to herein is covalent or ionic bonding, more desirably covalent bonding.

An embodiment of the invention relates to a method of forming a patterned chemical epitaxy template for orientation of a self-assemblable block copolymer. The method involves applying a primer layer of a primer composition to a surface of a substrate.

The primer composition comprises a first polymer moiety having a chemical affinity with the first polymer blocks of the self-assemblable block copolymer, and a second polymer moiety having a chemical affinity with the second polymer blocks of the self-assemblable block copolymer. It will be understood that the use of first and second in this context is unimportant, so for instance the first polymer moiety and first polymer blocks may be both hydrophilic, or may be both hydrophobic. In a suitable arrangement, the first polymer moiety and the first polymer blocks of the self-assemblable block copolymer may be of the same first monomer. It may also be that the second polymer moiety and the second polymer blocks of the block copolymer are of the same monomer (this second monomer being different to the first monomer).

The primer layer thus presents a primer layer surface comprising the first and second polymer moieties. This is an arrangement used to provide a neutral orientation layer for the block copolymer, and suitably, the primer layer acts as such a neutral orientation layer for the self-assemblable block copolymer, with either first or second blocks able to nucleate at an otherwise unmodified surface of the primer layer with the desired side-by-side arrangement for the domains of the block copolymer at the primer surface.

The primer layer may be deposited by a suitable means such as spin coating from a solution in solvent, or the like, to provide the layer as a thin film on the substrate. The primer layer may suitably be rendered insoluble by crosslinking the material within the layer or by bonding of the molecules of the primer layer to the surface of the underlying substrate. In an embodiment, the primer layer may be a very thin layer such as 15 nm or less in thickness, or it may have a greater thickness.

The method involves selectively exposing the surface, the primer layer and any overlying layer to actinic radiation to provide exposed and unexposed regions. This exposure to the actinic radiation renders labile the first polymer moiety in the exposed region. By "labile" it is meant that the first polymer moiety is no longer linked or bonded to the remainder of the primer layer in the exposed region, and so it is rendered into a state where it may be easily removed from the exposed region, for instance by treatment with a suitable solvent, or by evaporation.

The actinic radiation may suitably be UV radiation such as DUV (deep UV) or EUV (extreme UV) radiation. The selective exposure to actinic radiation may be by patterning of the EUV or DUV radiation with a lithography apparatus. A conventional lithographic patterning method, such as mask or maskless EUV or DUV lithography, may be used to provide a desired high resolution exposure pattern on the primer layer to give the exposed and unexposed regions, or a method such as electron beam lithography may be employed. Typical DUV lithography is at about 193 nm. EUV radiation may have a wavelength from about 5 nm to about 20 nm.

The method involves removing the labile first polymer moiety from the exposed region in order to deplete the primer layer surface in the exposed region of the first polymer moiety. This removal (which may be total or partial) results in the formation of the patterned chemical epitaxy template. The depletion of first polymer moiety in the exposed region of the primer surface layer renders this region relatively richer in the second polymer moiety, resulting in the exposed region having a higher chemical affinity for the second polymer blocks of the self-assemblable block copolymer, while the unexposed region of the primer surface layer remains neutral.

Hence, the exposed region, where the first polymer moiety is depleted, acts as a preferred site for nucleation of the second polymer blocks of the block copolymer.

In a suitable arrangement, the primer composition may comprise a first compound having the first polymer moiety linked into the compound by a cleavable group, wherein the cleavable group is cleaved as a result of exposure to actinic radiation to render the first polymer labile, and a second compound comprises the second polymer moiety.

The first compound, in this arrangement, may comprise an end group adapted to bond the first compound to the substrate, the end group being linked to the first compound by the cleavable group. A suitable end group may be an OH group.

For such an arrangement, the second compound may alternatively or additionally comprise an end group, such as an OH group, adapted to bond the second compound to the substrate.

In a further suitable arrangement, the primer composition itself may comprise a block copolymer, with the block copolymer comprising the first and second polymer moieties as its blocks. The block copolymer of the primer composition may further comprise an end group to bond the block copolymer to the substrate, with the end group linked to a terminus of the second polymer moiety, wherein an opposed end of the second polymer moiety is linked to the first polymer moiety by a cleavable group, and wherein the cleavable group is cleaved as a result of exposure to actinic radiation to render the first polymer labile. However, the block copolymer of the primer composition is not to be considered as a self-assemblable block copolymer, and will typically have a lower molecular weight than the self-assemblable block copolymer. For instance, the molecular weight of the block copolymer of the primer composition may be 20% of that of the self-assemblable block copolymer, or even less.

In a further suitable arrangement, the primer composition may comprise a block copolymer comprising the first and second polymer moieties as blocks. The block copolymer may further comprise an end group to bond the block copolymer to the substrate and linked to a terminus of the second polymer moiety, wherein the end group is also linked to a terminus of the first polymer moiety by a cleavable group, and wherein the cleavable group is cleaved, as a result of exposure to actinic radiation, to render the first polymer labile.

For any of these arrangements, the end groups may be, or comprise, a hydroxyl group.

For any of the arrangements set out above, a resist layer of a resist adapted to generate acid on exposure to the actinic radiation may be applied over the primer layer to generate acid in the exposed region of the resist layer, with the cleavable group cleaved by the acid generated in the exposed region. This arrangement may be effected by the acid, so generated, diffusing from the resist layer into an underlying primer layer.

In a further arrangement, the first polymer moiety may be rendered labile by photolytic depolymerization of the first polymer moiety in the exposed region. In other words, the first polymer moiety may be a polymer moiety where the polymer moiety is decomposed into its component monomer upon exposure to the actinic radiation.

With this arrangement, with the first polymer moiety rendered labile by photolytic depolymerization of the first polymer moiety in the exposed region, the primer composition may comprise a first compound comprising the first polymer moiety and a second compound comprising the second polymer moiety, each first and second compound comprising an end group to bond its respective polymer moiety to the substrate.

For a further arrangement, with the first polymer moiety rendered labile by photolytic depolymerization of the first polymer moiety in the exposed region, the primer composition may comprise a block copolymer comprising the first and second polymer moieties as blocks, with the block copolymer further comprising an end group to bond the block copolymer to the substrate and linked to a terminus of the second polymer moiety, and with an opposed terminus of the second polymer moiety linked to the first polymer moiety.

For a further arrangement, with the first polymer moiety rendered labile by photolytic depolymerization of the first polymer moiety in the exposed region, the primer composition may comprise a branched tri-block copolymer comprising the first and second polymer moieties as blocks, the tri-block copolymer having the first polymer and second polymer moiety each bonded to a first terminus of a third block, and an opposed terminus of the third block having an end group to bond the third block to the substrate.

For any of the above mentioned arrangements, the end groups may be, or comprise, a hydroxyl group.

With regard to the cleavable groups mentioned herein, such photo-cleavable groups are known in the art. For instance, a suitable photocleavable group may be the o-nitrobenzyl group.

According to an embodiment of the invention, there is provided a method of forming a self-assembled block copolymer layer on a surface of a substrate, the method comprising:

providing a surface of a substrate, having a patterned chemical epitaxy template thereon, by a method described herein, depositing a self-assemblable polymer layer directly onto the patterned chemical epitaxy template, and treating the self-assemblable block copolymer layer to provide self-assembly into an ordered block copolymer layer.

Directed self-assembly is achieved as set out herein, with a patterned chemical epitaxy template as described herein used to direct self-assembly.

According to an embodiment of the invention, there is provided a method of forming a patterned chemical epitaxy template, for orientation of a self-assemblable block copolymer comprising first and second polymer blocks, on a surface of a substrate, the method comprising:

applying a primer layer of a primer composition to the surface, selectively exposing the primer layer to EUV radiation to provide exposed and unexposed regions, to photolytically decompose the primer layer into decomposition products in the exposed region, and removing the decomposition products from the exposed region to denude the substrate of primer layer in the exposed region to form the patterned chemical epitaxy template.

Suitably, spacings between a plurality of exposed regions of the patterned chemical epitaxy template will be such that a corresponding second domain of the self-assembled block copolymer may deposit with each exposed region aligned with a second domain positioned thereon. The size of the exposed region depleted of first polymer moiety will suitably be of a size comparable to the size of the corresponding second domain of the self-assembled block copolymer.

An intermediate layer having a high absorptivity for EUV radiation, by which is meant radiation having a wavelength from about 5 nm to about 20 nm, may be provided as the uppermost layer of the substrate.

According to an embodiment of the invention, there is provided a method of forming a patterned chemical epitaxy template, for orientation of a self-assemblable block copolymer comprising first and second polymer blocks, on a surface of a substrate, the method comprising:

applying a solid primer layer of a primer composition to the surface, rendering an outer surface of the primer layer hydrophilic by chemical modification to provide hydrophilic moieties at the outer surface, and selectively exposing the primer layer to UV radiation to heat an exposed region, to bring the exposed region to a temperature in excess of a glass transition temperature for the primer layer, to render mobile the hydrophilic moieties, wherein the hydrophilic moieties migrate from the outer surface into the primer layer in the exposed region to form the patterned chemical epitaxy template.

Suitably, the unexposed region may have a neutral outer surface as a result of the chemical modification, with the exposed region rendered hydrophobic as a result of the hydrophilic moieties migrating away from the outer surface of the primer layer and into its bulk.

According to an embodiment of the invention, there is provided a lithography method for patterning a surface of a substrate by resist etching, the method comprising providing an ordered block copolymer layer at the surface by a method described herein, wherein the ordered block copolymer layer is used as a resist layer. The ordered block copolymer layer is used as a resist layer to pattern the substrate using a method known in the art, with one of the domain types removed and the remaining domain type providing resist features.

According to an embodiment of the invention, there is provided a method of forming a device topography at a surface of a substrate, the method comprising using the ordered block copolymer layer, formed by a method described herein, as a resist layer while etching the substrate to provide the device topography.

The patterned chemical epitaxy template is not limited to a linear template; for instance the template may be in the form of a 2-D array of dots suitable as a pattern for use with a cylindrical or square (tetragonal) phase-forming block copolymer. The patterned chemical epitaxy template may be used, for instance, to guide the self-organization of lamellar or cylindrical phases, where the different domain types are arranged side-by-side on a surface of a substrate.

The substrate may have an anti-reflection coating for the actinic radiation at the surface. The primer layer may be applied by any suitable method such as spin coating or spraying, or even in some arrangements by vapor deposition.

Typically, the first and second polymer moieties may be of the same monomer as the first and second blocks of the self-assemblable block copolymer, respectively.

The patterned chemical epitaxy template will typically comprise unexposed and exposed regions, with the exposed region depleted of first moiety. This depletion may suitably be achieved by washing the primer layer with an appropriate solvent for the labile first moiety (or its monomer in the case of depolymerization). The patterned chemical epitaxy template may have the same periodicity (i.e. unit cell pitch) as the self-assembled block copolymer that it is intended to direct during self-assembly, but more usually, the periodic spacing between adjacent portions of one region will correspond to a plurality of unit cells for the self-assembled polymer. This allows for the effect known as density multiplication (sometimes also referred to as pitch multiplication). So, for instance, using an example of a lamellar self-assembled polymer phase, having domains of width W1 for the first block and width W2 for the second block, the unit cell period or pitch of the self-assembled polymer will be W1+W2. For the patterned chemical epitaxy template, if this has the same pitch, then it will have alternating stripes of first region having width W1 and second region having width W2, each region arranged for chemical affinity with (or neutrality to) the corresponding polymer block.

A further suitable arrangement may have, for instance, exposed regions of width W1, having high chemical affinity for the second block, separated by unexposed regions of width [n.(W2+W1)+W2], where n is an integer of value 1 or more, such as from 1 to 20, or 1 to 10, for instance 1, 2, 3, 4, 5, 6, 7, 8, 9 or 10 the unexposed region having similar chemical affinity (i.e. neutral chemical affinity) for first and second blocks.

The width of the first region may be, say from 0.4 W1 to 1.5 W1 (i.e. near to but not exactly W1) provided that the periodicity of the first region corresponds to n.[W1+W2], where n is an integer as already set out. In other words, it is not essential that the narrowest features of the chemical epitaxy pattern have exactly the same dimension as the corresponding domain of the self-assembled polymer.

BRIEF DESCRIPTION OF THE DRAWINGS

Specific embodiments of the invention will be described with reference to the accompanying Figures, in which.

DETAILED DESCRIPTION

Figure 1A:
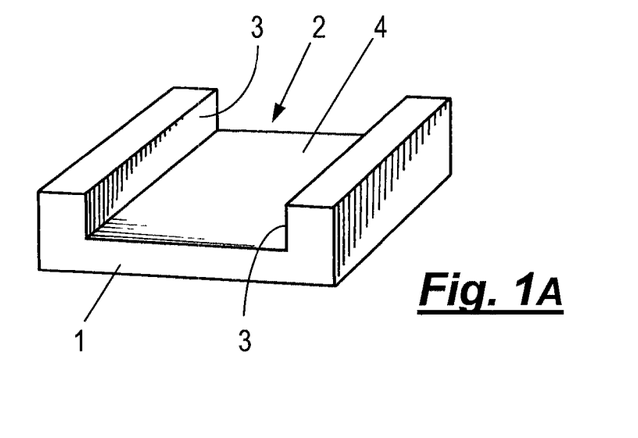
FIGS. 1A to 1C schematically depict directed self-assembly of A-B block copolymer onto a substrate by graphoepitaxy and formation of a relief pattern by selective etching of one domain.
Figure 1B:
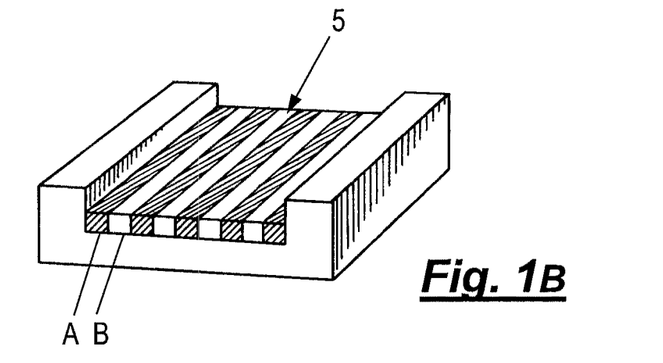
Figure 1C:
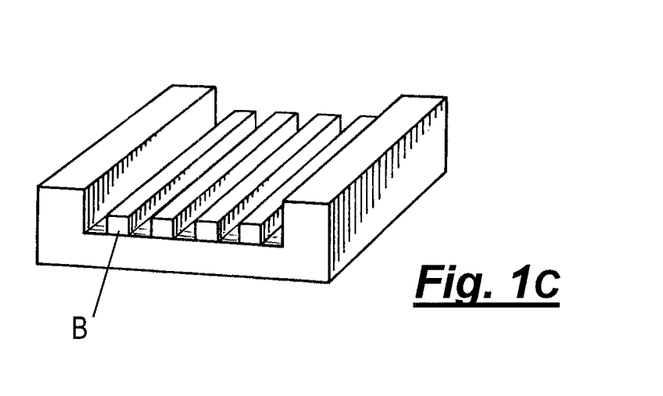

FIG. 1A shows a substrate 1 with a trench 2 formed therein bounded by side walls 3 and a bottom surface 4. In FIG. 1B, a self-assemblable A-B block copolymer with, e.g., hydrophilic A blocks and, e.g., hydrophobic B blocks has been deposited into the trench to form a layer 5 with alternating stripes of A and B domains which have deposited as a lamellar phase separated into discrete micro-separated periodic domains during deposition of the block copolymer. This is referred to as graphoepitaxy. The type A domains have nucleated adjacent to the a side wall 3, which is also, e.g., hydrophilic. In FIG. 1C, the type A domains have been removed by selective chemical etching, leaving the type B domains to form a relief pattern in the trench where they may serve as a template for subsequent patterning of the bottom surface 4, for instance by further chemical etching. Selective removal may be achieved, for instance, by selective photo-degradation or photo-cleavage of a linking agent between blocks of the copolymer and subsequent solubilization of one of the blocks. The pitch or wavelength of the self-assembled polymer structure 5 and the width of the trench 4 are arranged so that a number of alternating stripes of domains can fit into the trench with a type A domain against each side wall.

Figure 2A:
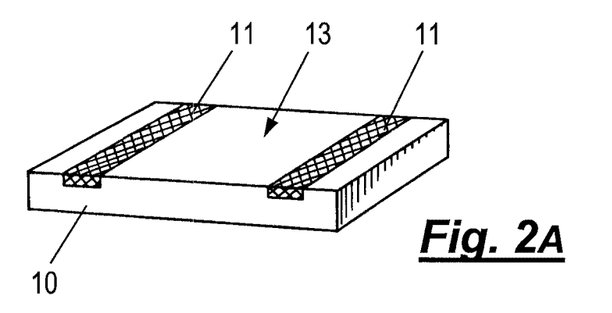
FIGS. 2A to 2C schematically depict directed self-assembly of A-B block copolymer onto a substrate by chemical pre-patterning and formation of a relief pattern by selective etching of one domain.
Figure 2B:
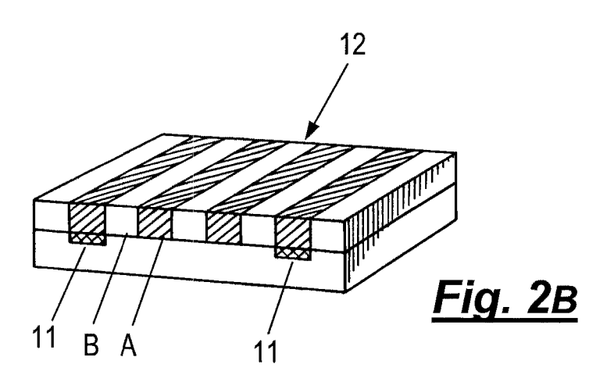
Figure 2C:
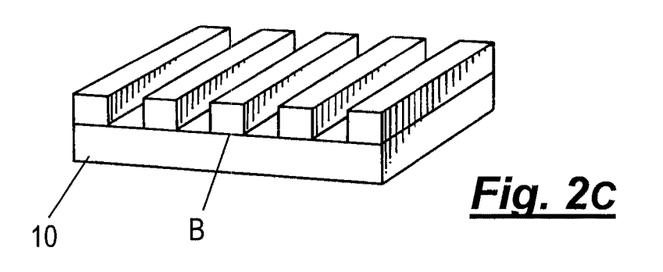

FIG. 2A shows a substrate 10 with a chemical pattern in the form of pinning stripes 11 which have been chemically formed on the surface 13 to provide regions with a higher affinity for the type A blocks of the polymer. In FIG. 2B, a self-assemblable A-B block copolymer with, e.g., hydrophilic A blocks and, e.g., hydrophobic B blocks has been deposited onto the surface 13 of substrate 10 to form a lamellar phase layer 12 with alternating stripes of A and B domains which have phase separated into discrete micro-separated periodic domains during deposition of the block copolymer. This is referred to as chemical pre-patterning. The type A domains have nucleated atop the pinning stripes 11, which are also, e.g., hydrophilic. In FIG. 1C, the type A domains have been removed by selective chemical etching, leaving the type B domains to form a relief pattern on the surface 13 where they may serve as a template for subsequent patterning of surface 13, for instance by further chemical etching. The pitch or wavelength of the self-assembled polymer structure 12 and the spacing of the pinning stripes 11 are arranged so that a number of alternating stripes of domains can fit between the pinning stripes 11 with a type A domain atop each pinning stripe 11.

In the following examples, the di-block copolymer used as self-assemblable polymer is poly(styrene-b-methylmethacrylate) block copolymer denoted by the acronym PS/PMMA.

Figure 3:
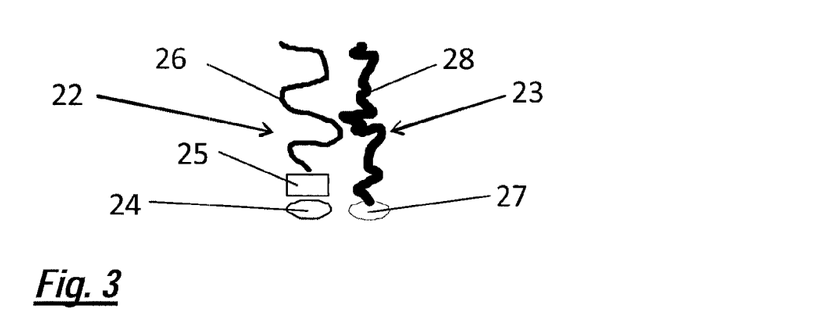
FIG. 3 schematically depicts the first and second compounds of a primer composition.

Turning now to FIG. 3, this shows a schematic depiction of first and second compounds of a first embodiment of a primer composition as oriented in a primer layer on a substrate. The first compound 22 has a first polymer moiety 26 which is linked to an end group 24, in this case an OH group, by a cleavable group 25. The first polymer moiety 26 comprises a methyl methacrylate monomer, making it hydrophilic in nature (PMMA).

The second compound 23 comprises a second polymer moiety 28 linked to a head group 27. For this compound, the second polymer moiety 28 comprises a styrene monomer (PS), with the end group again being an OH group.

Figure 4:
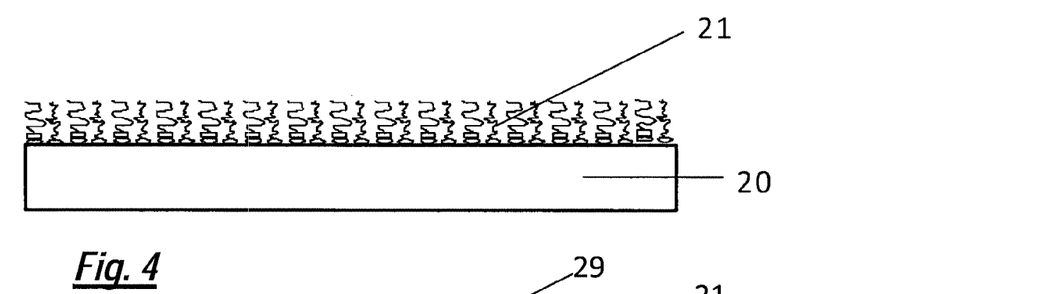
FIGS. 4 to 6 depict stages in the use of a primer composition in a method according to an embodiment of the invention to provide a directed, ordered self-assembled block copolymer layer on a substrate.

In FIG. 4, the primer composition is shown with the first and second compounds oriented on a surface of a substrate 20 as a primer layer 21 with the end groups 24, 27 bonding the polymer moieties of the first 22 and second 23 compounds respectively to the surface of the substrate 20.

Figure 5:
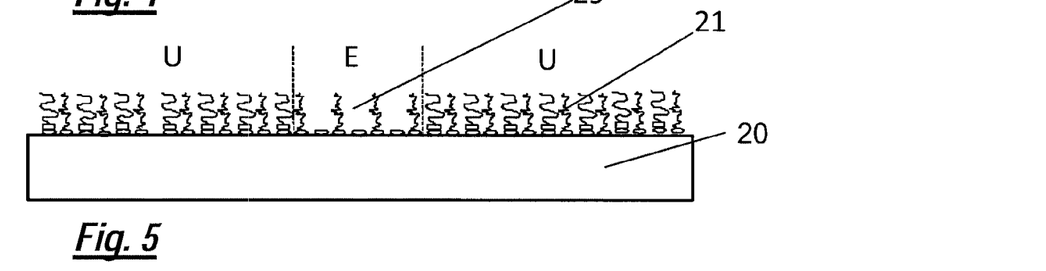

FIG. 5 schematically depicts irradiation of the deposited primer layer 21 with actinic radiation in the form of ultraviolet radiation to leave parts of the primer layer 21 unexposed, denoted by U, and with a region 29 of the primer layer exposed to ultraviolet radiation (denoted by E). In the exposed region 29, the cleavable group 25 has been cleaved by the actinic radiation, leaving substantially only second polymer moiety remaining in this exposed region 29. The first polymer moieties 26, of PMMA, disengaged from the substrate 20 and end group 24 as a result of the cleavage of the cleavable group 25, have been washed away using a solvent such as an acetic acid solution. The resulting layer thus has unexposed region 21 which is neutral to the domains of a PS/PMMA block copolymer (containing both first and second polymer moieties within a layer) in addition to exposed region 29 (containing substantially exclusively second polymer moieties within a layer) which have a high chemical affinity for the hydrophobic PS domain of a PS/PMMA block copolymer and a low chemical affinity for the PMMA domain of the block copolymer. The primer layer and resulting template may have a thickness of 15 nm or less.

Figure 6:
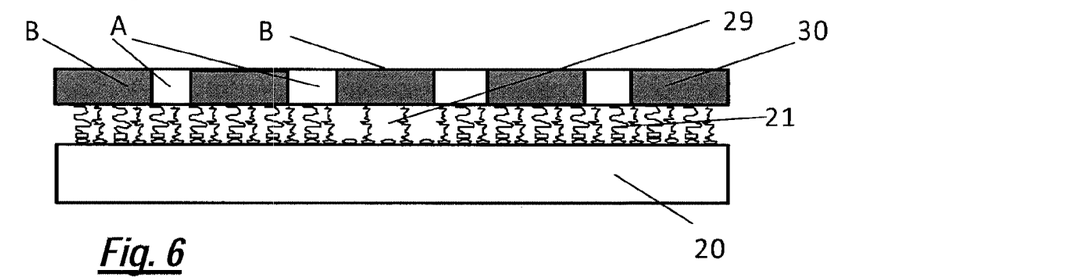

In FIG. 6, a PS/PMMA block copolymer 30 has been deposited by spincoating on top of the patterned chemical epitaxy template thus formed. The block copolymer 30 has oriented with a PS domain denoted by the letter B preferentially oriented over the exposed region 29, with which it has a high chemical affinity. This positioning of the PS domain then directs the subsequent assembly of adjacent domains over the adjacent unexposed neutral primer layer 21, acting as a nucleation or pinning point for the self-assembled ordered block copolymer layer 30.

The photo-cleavable group 25 will cleave upon irradiation with radiation of the appropriate wavelength and the polymer moiety 26 attached to the photo-cleavable group 25 is split off from the end group 24. An example of a photo-cleavable group is the o-nitrobenzyl protecting group. However, this invention is not limited to use of this specific group.

The embodiment of the method of the invention shown in FIGS. 4 to 6 involves the used of a mixed polymer primer layer comprising two compounds which may be depicted as:

(a) HO-[PCG]-[A polymer block]
mixed with
HO-[B polymer block],
where [PCG] denotes a photo-cleavable group, and in the embodiment of FIGS. 4 to 6 the A polymer block is PMMA and the B polymer block is PS.

Other primer compositions employing a photo-cleavable group may be used in embodiments of the invention. For instance, suitable primer compositions may be as follows:
(b) HO-[B polymer block]-[PCG]-[A polymer block].
[PCG]-[A polymer block]
(c) HO-[C polymer block]<
[B polymer block]
where the C polymer block may be the same as one of the A or B blocks, or may be of a different monomer. For the embodiment shown in FIGS. 3 to 6, a primer layer of compound (b) or compound (c) may replace composition (a). When the PCG is cleaved in the exposed region, the remaining compound will be:
for (b), HO-[B polymer block], and
for (a), HO-[C polymer block]-[B polymer block],
so in each case, the exposed region is rendered chemically compatible with B polymer blocks of the self-assemblable block copolymer after the [A polymer block] has been rendered labile and substantially removed, for instance by washing.

Other compounds for use in a primer layer for use with the methods herein may be used. Rather than the first polymer moiety being attached to an end group by a photo-cleavable group, the actinic (e.g., UV) radiation used may be employed to give photolytic decomposition of the first polymer moiety, for instance when the first polymer moiety is PMMA as set out hereinbefore. The following are examples of arrangements of primer layer which may be suitable in such circumstances:

Type 1) A mixed layer of polymer of type PS-OH and PMMA-OH, with the OH acting as end group to bond the polymer, Type 2) A linear PMMA-PS-OH block copolymer as primer layer, and Type 3) A branched block copolymer as primer layer,
where C is a third polymer block used to link the PMMA and PS blocks of the primer compound to the substrate surface through the OH end group.

For each primer layer type, the photolytic depolymerization of the PMMA block upon irradiation may be used to directly write a chemical pattern into the primer layer. PMMA will depolymerize upon irradiation with, e.g., UV radiation with a wavelength less than or equal to about 260 nm of sufficient intensity and the resulting monomeric depolymerization products can simply be substantially removed by rinsing with acetic acid solution. The irradiated areas where PMMA is depleted may act as an anchor region, in an otherwise neutral layer, for polystyrene blocks of the PS/PMMA block copolymer. In this way a patterned chemical epitaxy layer is obtained.

In a further embodiment, photo-cleavage to release the first polymer moieties may be mediated through photo-generation of acid (PAG—photo-acid-generation) in an overlying PAG resist layer, with the acid subsequently diffusing into the primer layer to cleave the cleavable group as a result of exposure of the overlying PAG resist layer to the actinic (e.g., UV) radiation.

Currently, higher resolution using 193 nm lithography may be obtained by means of use of finely-tuned PAG resist compositions that are able to translate, for instance, a 10% difference in UV irradiation intensity into a sharp chemical contrast. Such resists are based on the use of UV to generate acid in the resist layer, with the acid subsequently cleaving bonds in the resist to render it soluble. An acid-cleavable group (ACG) such as an O—(C=O)—O group may be used in the primer composition to bond the first polymer moiety. This acid cleavable group is similar to the group that is cleaved in the PAG resist in conventional use (e.g., poly(4-t-butoxycabonyloxystyrene). Cleavage of the acid-cleavable group by acid photo-generated from an overlying resist layer may thus be used to make the first polymer moiety labile in an exposed region. For instance, the primer layer may be of: HO-[ACG]-[A polymer block] mixed with HO-[B polymer block], where [ACG] denotes an acid-cleavable group, combined with an overlying PAG resist layer.

Upon irradiation with suitable radiation (e.g., 193 nm UV radiation), protons are formed by photo-acid generation which will not only cleave resist groups, but will also locally cleave the ACG in the HO-[ACG]-[A polymer block] compound of the primer composition, rendering labile the first polymer moiety—in this case the [A polymer block]. The use of the optimized PAG resist allows the formation of the patterned chemical epitaxy template to be achieved with a resolution that is similar to the resolution obtainable for the optimized resist layer. After illumination with the radiation, the entire resist layer and labile A polymer block (PMMA in this example) may be removed by a wash with, e.g., tetramethylammonium hydroxide (TMAH) and organic solvent, leaving the resulting patterned chemical epitaxy template.

In an embodiment, exposure of a region of the primer layer with actinic (e.g., UV) radiation or heat source may lead to a local heating effect when the radiation is absorbed by, e.g., chromophores in the primer layer and the excited states decay via a non-radiative pathway. In this way the exposed region of primer layer may be heated locally to a temperature above its glass transition temperature. The increased mobility in the heated area may result in a rearrangement of the polymer chains and/or alteration of a surface property for the primer layer.

For instance, a UV-absorbing non-fluorescent dye molecule may be blended in a primer layer composition with a crosslinkable polymer which has a high affinity for the hydrophobic block B of an A/B block copolymer. After deposition and crosslinking of the layer on a substrate the polymer layer is treated with UV and ozone to obtain a hydrophilically modified (oxidized) surface for the primer layer, such that the surface is preferentially wetted by hydrophilic block A. Upon exposure of a region of the primer layer to radiation or another heat source, the polymer network will be locally heated above its glass transition temperature in the irradiated portion and this may allow internalization of the hydrophilic surface groups, into the body of the layer, in the exposed region, resulting in the exposed region being rendered more hydrophobic, and hence having a higher chemical affinity for the B domains, or neutral to both A and B domains. Hence the exposure of this embodiment may give rise to a patterned chemical epitaxy template.

In an embodiment, direct patterning of a primer layer with extreme ultraviolet (EUV) radiation is employed to provide direct patterning of a primer layer in order to provide a patterned chemical epitaxy template.

With EUV radiation, having a wavelength of from about 5 nm to about 20 nm, high resolution patterning is possible. This may be useful for directed self-assembly of a block copolymer via chemical epitaxy. In an embodiment, the size of a chemical epitaxy feature should be roughly of the same dimension as the width of a domain of the self-assembled block copolymer. For instance, for a block copolymer that forms pillars of about 20 nm diameter arranged in an hexagonal array, the alignment features of the chemical epitaxy template should ideally be exposed region of diameter of about 20 nm as already explained hereinbefore.

In an embodiment, EUV radiation may be used to directly expose a portion of a primer layer where the primer layer may be a chemically neutral layer for the block copolymer domain, such as a primer layer of a composition comprising first and second polymer moieties as set out herein, which allows either domain of the block copolymer to be deposited upon it without excessive total free energy penalty. The high photon energy of the EUV radiation will give rise to photolytic decomposition of the primer layer into a monomer or smaller fragment, and this decomposition product may be substantially removed from the exposed primer layer by a selective rinse step, where low molecular weight fractions are removed from the primer layer.

The result is a patterned chemical epitaxy template with, e.g., neutral unexposed regions alternating with regions where the primer layer has been removed and so the underlying surface of the substrate is exposed. This may mean, for instance, that the exposed region provides an underlying substrate having a high chemical affinity for the hydrophilic domain of the A/B block copolymer.

Suitably, to provide good absorption of the EUV radiation, the primer layer in this arrangement may be about 15 nm or more in thickness.

For this EUV embodiment, it may be useful to provide an intermediate layer of a material highly absorptive to EUV radiation on the surface of the substrate, located between the surface of the substrate and the overlying primer layer. This may allow for the generation of secondary electrons from EUV excitation of the intermediate layer, with back-scattered secondary electrons contributing to the photolytic decomposition of the primer layer in the exposed region.

For instance, the intermediate layer may be a layer of, e.g., hafnium oxide tantalum oxide, and/or tungsten oxide. Other suitable intermediate layer materials may include metals such as Ni, Co, or Cu but in these cases an oxide layer (such as silicon oxide) is desired between the intermediate layer and the underlying substrate, where the substrate is of silicon. This oxide layer is to protect against formation of an undesirable silicide which may arise from diffusion of metal into the silicon. The oxide referred to in this paragraph may be a stoichiometric or non-stoichiometric compound.

The described and illustrated embodiments are to be considered as illustrative and not restrictive in character, it being understood that only preferred embodiments have been shown and/or described and that all changes and modifications that come within the scope of the inventions as defined in the claims are desired to be protected. An embodiment of the invention allows for formation onto a substrate of a patterned chemical epitaxy template by a simple, direct UV photolithography technique without need for complex and/or undesirable process steps such as thermal reflow or lift-off etch processes for removal of residual resist.

An embodiment of the present invention relates to lithography methods. The methods may be used in processes for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc. An embodiment of the invention is also of use to create regular nanostructures on a surface for use in the fabrication of integrated circuits, bit-patterned media and/or discrete track media for magnetic storage devices (e.g. for hard drives).

In particular, an embodiment of the invention is of use for high resolution lithography, where features patterned onto a substrate have a feature width or critical dimension of about 1 µm or less, typically about 100 nm or less or even about 10 nm or less.

Lithography may involve applying several patterns onto a substrate, the patterns being stacked on top of one another such that together they form a device such as an integrated circuit. Alignment of each pattern with a previously provided pattern is an important consideration. If patterns are not aligned with each other sufficiently accurately, then this may result in some electrical connections between layers not being made. This, in turn, may cause a device to be non-functional. A lithographic apparatus therefore usually includes an alignment apparatus, which may be used to align each pattern with a previously provided pattern, and/or with alignment marks provided on the substrate.

In this specification, the term "substrate" is meant to include any surface layers forming part of the substrate, or being provided on a substrate, such as other planarization layers or anti-reflection coating layers which may be at, or form, the surface of the substrate.

The invention claimed is:

1. A method of forming a patterned chemical epitaxy template, for orientation of a self-assemblable block copolymer comprising first and second polymer blocks, on a surface of a substrate, the method comprising:
   applying a primer layer of a primer composition to the surface, the primer composition comprising a first polymer moiety having a chemical affinity with the first polymer blocks and a second polymer moiety having a chemical affinity with the second polymer blocks, wherein the primer layer presents a primer layer surface comprising the first and second polymer moieties,
   selectively exposing the surface, the primer layer and any overlying layer to actinic radiation to provide exposed and unexposed regions, to render labile the first polymer moiety in the exposed region, and
   removing the labile first polymer moiety from the exposed region, while leaving at least some of the second polymer moiety in the exposed region, to deplete the primer layer surface in the exposed region of first polymer moiety to form the patterned chemical epitaxy template.

2. The method of claim 1, wherein the primer composition comprises a first compound having the first polymer moiety linked into the compound by a cleavable group,
   wherein the cleavable group is cleaved as a result of exposure to actinic radiation to render the first polymer labile, and
   wherein a second compound comprises the second polymer moiety.

3. The method of claim 2, wherein the first compound comprises an end group to bond the first compound to the substrate, the end group being linked to the first compound by the cleavable group.

4. The method of claim 2, wherein the second compound comprises an end group to bond the second compound to the substrate.

5. The method of claim 4, wherein the end group is, or comprises, a hydroxyl group.

6. The method of claim 2, wherein a resist layer of a resist adapted to generate acid on exposure to the actinic radiation is applied over the primer layer to generate acid in the exposed region of the resist layer, and
wherein the cleavable group is cleaved by the acid generated in the exposed region.

7. The method of claim 1, wherein the primer composition comprises a block copolymer,
the block copolymer comprising the first and second polymer moieties as blocks, and further comprising an end group to bond the block copolymer to the substrate and linked to a terminus of the second polymer moiety,
wherein an opposed end of the second polymer moiety is linked to the first polymer moiety by a cleavable group, and
wherein the cleavable group is cleaved as a result of exposure to actinic radiation to render the first polymer labile.

8. The method of claim 1, wherein the primer composition comprises a block copolymer,
the block copolymer comprising the first and second polymer moieties as blocks, and further comprising an end group to bond the block copolymer to the substrate and linked to a terminus of the second polymer moiety,
wherein the end group is also linked to a terminus of the first polymer moiety by a cleavable group, and
wherein the cleavable group is cleaved as a result of exposure to actinic radiation to render the first polymer labile.

9. The method of claim 1, wherein the first polymer moiety is rendered labile by photolytic depolymerization of the first polymer moiety in the exposed region.

10. The method of claim 9, wherein the primer composition comprises a first compound comprising the first polymer moiety and a second compound comprising the second polymer moiety, each first and second compound comprising an end group to bond its respective polymer moiety to the substrate.

11. The method of claim 9, wherein the primer composition comprises a block copolymer comprising the first and second polymer moieties as blocks,
the block copolymer further comprising an end group to bond the block copolymer to the substrate and linked to a terminus of the second polymer moiety, and
wherein an opposed terminus of the second polymer moiety is linked to the first polymer moiety.

12. The method of claim 9, wherein the primer composition comprises a branched tri-block copolymer comprising the first and second polymer moieties as blocks,
the tri-block copolymer having the first polymer and second polymer moiety each bonded to a first terminus of a third block, and
wherein an opposed terminus of the third block has an end group adapted to bond the third block to the substrate.

13. The method of claim 9, wherein the end group is, or comprises, a hydroxyl group.

14. A method of forming a patterned chemical epitaxy template, for orientation of a self-assemblable block copolymer comprising first and second polymer blocks, on a surface of a substrate, the method comprising:
applying a primer layer of a primer composition to the surface, the primer composition comprising a first polymer moiety and a second different polymer moiety, wherein the primer layer presents a primer layer surface comprising the first and second polymer moieties,
selectively exposing the primer layer to EUV radiation to provide exposed and unexposed regions, to photolytically decompose the first and second polymer moieties into decomposition products in the exposed region, and
removing the decomposition products from the exposed region to denude the substrate of primer layer in the exposed region to form the patterned chemical epitaxy template.

15. The method of claim 14, wherein the primer layer overlies an intermediate layer between the primer layer and the surface, the intermediate layer being absorptive of the EUV radiation.

16. The method of claim 15, wherein the intermediate layer comprises hafnium oxide, tantalum oxide, and/or tungsten oxide.

17. The method of claim 15, wherein the intermediate layer comprises a metal and the intermediate layer overlies an oxide layer between the intermediate layer and the surface.

18. The method of claim 14, wherein the exposed region has a size of 20 nm or less.

19. A method of forming a patterned chemical epitaxy template, for orientation of a self-assemblable block copolymer comprising first and second polymer blocks, on a surface of a substrate, the method comprising:
applying a solid primer layer of a primer composition to the surface,
rendering an outer surface of the primer layer hydrophilic by chemical modification to provide hydrophilic moieties at the outer surface, and
selectively exposing the primer layer to UV radiation to heat an exposed region, to bring the exposed region to a temperature in excess of a glass transition temperature for the primer layer, to render mobile the hydrophilic moieties,
wherein the hydrophilic moieties migrate from the outer surface into the primer layer in the exposed region to form the patterned chemical epitaxy template.

20. The method of claim 19, wherein, after the exposing, the exposed region has a higher chemical affinity for the first polymer block or second polymer block, or is neutral to both first and second polymer blocks.

* * * * *